(12) United States Patent
Qi et al.

(10) Patent No.: US 10,952,356 B2
(45) Date of Patent: *Mar. 16, 2021

(54) SHIELDING PORTIONS OF AN ELECTRONIC DEVICE

(71) Applicant: Google LLC, Mountain View, CA (US)

(72) Inventors: Qi Qi, San Jose, CA (US); Wonjae Choi, San Jose, CA (US); Yi Tao, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/788,968

(22) Filed: Feb. 12, 2020

(65) Prior Publication Data

US 2020/0187395 A1 Jun. 11, 2020

Related U.S. Application Data

(63) Continuation of application No. 16/201,029, filed on Nov. 27, 2018, now Pat. No. 10,602,645.

(Continued)

(51) Int. Cl.
*H05K 5/00* (2006.01)
*H05K 9/00* (2006.01)
(Continued)

(52) U.S. Cl.
CPC ......... *H05K 9/0054* (2013.01); *G06F 1/1652* (2013.01); *G06F 1/1656* (2013.01);
(Continued)

(58) Field of Classification Search
None
See application file for complete search history.

(56) References Cited

U.S. PATENT DOCUMENTS 8,456,851 B2 * 6/2013 Grunthaner ............ H05K 1/147
361/749
8,830,195 B2 * 9/2014 Eom ................... H04M 1/0266
345/173

(Continued)

FOREIGN PATENT DOCUMENTS

EP 2725881 4/2014

OTHER PUBLICATIONS

PCT International Search Report and Written Opinion issued in International Application No. PCT/US2018/062550, dated Feb. 18, 2019, 18 pages.

(Continued)

*Primary Examiner* — Anthony Q Edwards
*Assistant Examiner* — Rashen E Morrison
(74) *Attorney, Agent, or Firm* — Fish & Richardson P.C.

(57) ABSTRACT

Methods, systems, and apparatus, for shielding a bending portion of a flexible display that can be incorporated in electronic devices. One of the apparatus includes a cover glass element; a driver integrated circuit (D-IC); a mandrel portion; a shaft portion; a panel, positioned between the cover glass element and the D-IC, and comprising an inner panel layer that wraps around at least a portion of the mandrel portion to form a bending portion of the panel, the panel attached on either side on the shaft portion; and a shielding layer positioned around the inner panel layer and configured to inhibit electromagnetic signals through the bending portion.

20 Claims, 10 Drawing Sheets

Related U.S. Application Data

(60) Provisional application No. 62/594,915, filed on Dec. 5, 2017.

(51) Int. Cl.
  *H05K 1/02*    (2006.01)
  *G06F 1/16*    (2006.01)
  *H04M 1/02*    (2006.01)

(52) U.S. Cl.
  CPC .......... *H04M 1/0268* (2013.01); *H05K 1/028* (2013.01); *H05K 1/0219* (2013.01); *H05K 5/0017* (2013.01); *G06F 2203/04102* (2013.01); *G06F 2203/04103* (2013.01); *G06F 2203/04107* (2013.01); *H05K 2201/10128* (2013.01)

(56) References Cited

U.S. PATENT DOCUMENTS

| | | | | |
|---|---|---|---|---|
| 9,798,414 | B2* | 10/2017 | Kim | G06F 3/0416 |
| 9,980,326 | B2* | 5/2018 | Kim | H01L 51/0097 |
| 10,244,622 | B2* | 3/2019 | Kim | H05K 1/147 |
| 2008/0043413 | A1* | 2/2008 | Okuda | G02F 1/133308 |
| | | | | 361/679.01 |
| 2009/0225253 | A1* | 9/2009 | Oohira | G02B 6/0073 |
| | | | | 349/58 |
| 2012/0087065 | A1* | 4/2012 | Kim | G06F 1/1656 |
| | | | | 361/679.01 |
| 2012/0176564 | A1* | 7/2012 | Hatakeyama | G02F 1/1345 |
| | | | | 349/62 |
| 2012/0314383 | A1* | 12/2012 | Oohira | G02F 1/13452 |
| | | | | 361/749 |
| 2013/0293816 | A1* | 11/2013 | Jung | H01L 27/3288 |
| | | | | 349/139 |
| 2016/0105951 | A1 | 4/2016 | Lee | |
| 2016/0174304 | A1* | 6/2016 | Kim | H01L 51/5253 |
| | | | | 313/511 |
| 2016/0179229 | A1* | 6/2016 | Ahn | G06F 3/04164 |
| | | | | 345/173 |

OTHER PUBLICATIONS

PCT International Preliminary Report on Patentability in International Application No. PCT/US2018/062550, dated Jun. 18, 2020, 13 pages.

* cited by examiner

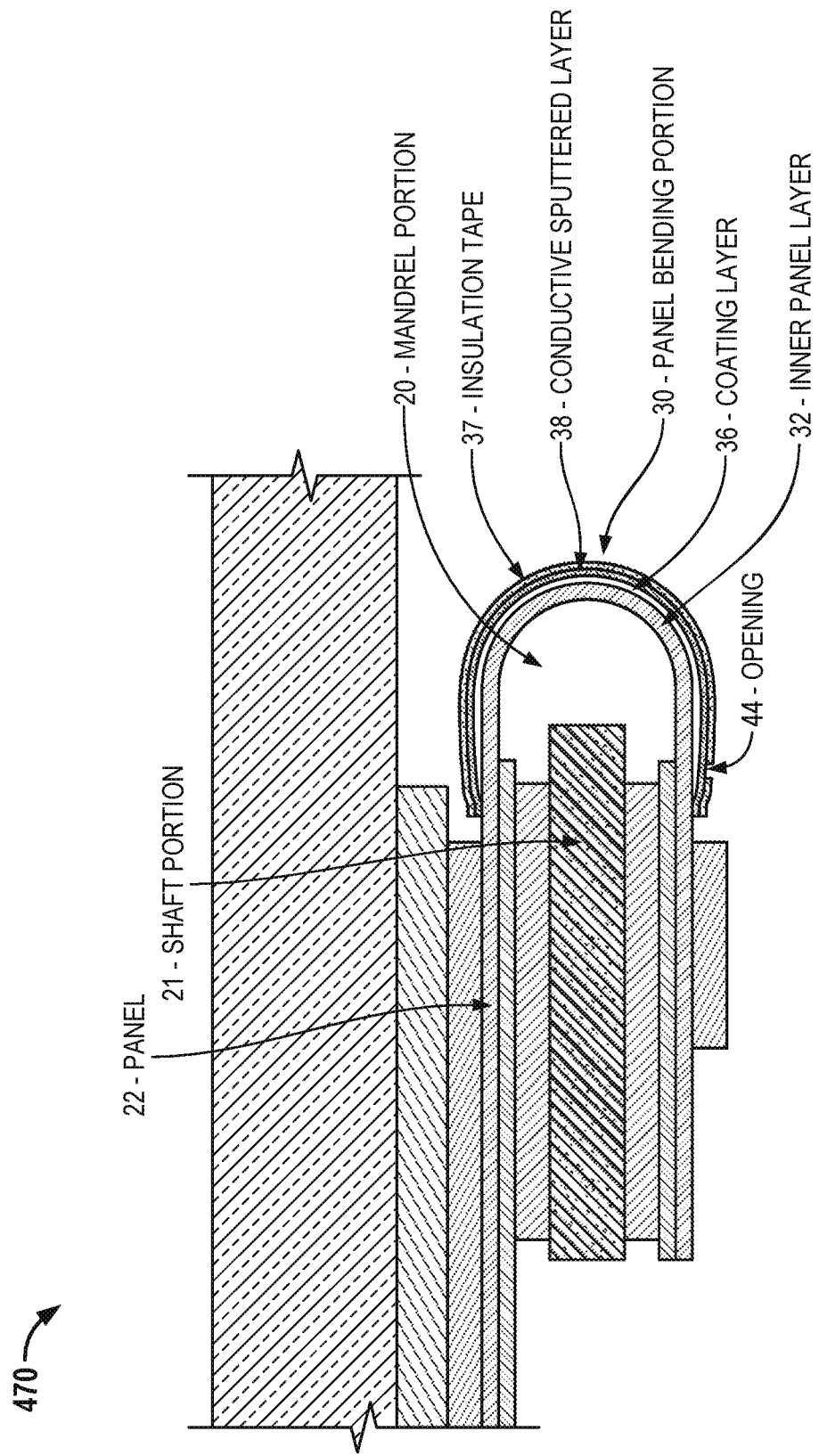

SHIELDING PORTIONS OF AN ELECTRONIC DEVICE

CROSS-REFERENCE TO RELATED APPLICATION

This application is a continuation of U.S. application Ser. No. 16/201,029, filed Nov. 27, 2018, which claims the benefit of U.S. Provisional Patent Application No. 62/594,915, filed on Dec. 5, 2017, which is incorporated herein by reference in its entirety.

TECHNICAL FIELD

This disclosure generally relates to electronic devices, and, more particularly, a method for shielding a bending portion of a flexible display panel of an electronic device.

BACKGROUND

Consumer electronics are equipment for everyday use and include devices for entertainment, such as gaming devices; communications, such as cell phones; and home office use, such as personal computers. As consumer electronics internal modules becomes more integrated, and thus more compact, the need for electrometric shielding between components becomes more critical.

SUMMARY

Implementations of the present disclosure are generally directed to a flexible display apparatus employed within, for example, a mobile communication device. More specifically, implementations are directed to a flexible display apparatus and methods of forming the flexible display apparatus. The flexible display apparatus includes a shielding layer at a bending portion of a panel of the display, which prevents or inhibits electromagnetic interference in this area of the device.

In a general implementation, a mobile communication device includes: a cover glass element; a driver integrated circuit (D-IC); a mandrel portion; a shaft portion; a panel, positioned between the cover glass element and the D-IC, and comprising an inner panel layer that wraps around at least a portion of the mandrel portion to form a bending portion of the panel, the panel attached on either side on the shaft portion; and a shielding layer positioned around the inner panel layer and configured to inhibit electromagnetic signals through the bending portion.

In another general implementation, a flexible display apparatus includes a cover glass element; a D-IC; a mandrel portion; a shaft portion; a panel, positioned between the cover glass element and the D-IC, and comprising an inner panel layer that wraps around at least a portion of the mandrel portion to form a bending portion of the panel, the panel attached on either side on the shaft portion; and a shielding layer positioned around the inner panel layer and configured to inhibit electromagnetic signals through the bending portion.

In yet another general implementation, a method of forming a mobile communication device flexible display apparatus includes: wrapping a panel around a mandrel portion to form a bending portion of the panel; attaching the wrapped panel on either side of a shaft portion; positioning the panel and wrapped mandrel portion between a cover glass element and a D-IC; and forming a shielding layer positioned around the bending portion of the panel, the shielding layer configured to inhibit electromagnetic signals through the bending portion.

In an aspect combinable with any of the general implementations, the flexible display apparatus of claim 1, further comprising a coating layer over the shielding layer.

In another aspect combinable with any of the previous aspects, further comprising at least two grounding pads positioned between the inner panel layer and the shielding layer and on opposite sides of the mandrel portion.

Another aspect combinable with any of the previous aspects, the coating layer has an opening exposing a portion of the shielding layer.

In another aspect combinable with any of the previous aspects, the coating layer comprises a polyimide (PI) substrate.

In another aspect combinable with any of the previous aspects, further comprising a second coating layer, wherein the second coating layer is positioned between the shielding layer and the inner panel layer.

In another aspect combinable with any of the previous aspects, the coating layer and the shielding layer are layers of a conductive tape positioned around the second coating layer.

In another aspect combinable with any of the previous aspects, the conductive tape has a thickness between 10 micrometers ($\mu m$) and 100 $\mu m$, and wherein the second coating layer has a thickness of between 100 $\mu m$ to 50 $\mu m$.

In another aspect combinable with any of the previous aspects, the inner panel layer comprises a conductive material.

Another aspect combinable with any of the previous aspects, the shielding layer comprises a second conductive material.

Another aspect combinable with any of the previous aspects, the panel is attached to either side of the shaft portion with pressure sensitive adhesive In another aspect combinable with any of the previous aspects, the shielding layer comprises a thin conductive layer deposited by sputtering or printing over the bending portion of the panel.

In another aspect combinable with any of the previous aspects, the shielding layer has a thickness of between 5 $\mu m$ and 20 $\mu m$.

In another aspect combinable with any of the previous aspects, the shaft portion comprises a foam material, and wherein the mandrel portion comprises an empty space.

In another aspect combinable with any of the previous aspects, the shaft portion and the mandrel portion are portions of a same component, and wherein the same component comprises a plastic material.

In another aspect combinable with any of the previous aspects, the plastic material comprises a thermosoftening plastic Integrating shielding at a display module level provides, for example, increased effectiveness because the shielding is close to a source of electromagnetic interference. The shielding also saves internal space compared with added shielding at a system level.

The details of one or more implementations of the present disclosure are set forth in the accompanying drawings and the description below. Other features and advantages of the present disclosure will be apparent from the description and drawings, and from the claims.

DESCRIPTION OF DRAWINGS

FIGS. 2, 3A-3B, and 4A-4C illustrate various embodiments of a panel bending portion of a flexible display with an added shielding layer at the bending.

DETAILED DESCRIPTION

A display in a consumer electronic device may have a cushion layer, which includes a layer comprised of a conductive material, such as copper. This cushion layer can be used for shielding from a panel backside. The display may include a bending portion/region around a mandrel. In some implementations, the panel has one layer of polyimide substrate and one metal trace layer at the bending portion. This bending portion, however, may not be shielded. Such a lack of shielding at the bending portion can allow electromagnetic interference to antennas and/or cause desense issues.

In view of the foregoing, implementations of the present disclosure are generally directed to a method and apparatus for shielding a bending portion of a flexible display that can be incorporated in electronic devices, such as a consumer electronic module. In some implementations, the described method adds a second or outer metal trace layer at the bending portion. In some implementations, the described method may also add a second polyimide substrate. In some implementations, the second metal trace layer can be utilized as a shielding layer, while the inner metal trace layer can be used for data, power metal traces, and so forth. For example, the shielding layer (e.g., the second metal trace layer) prevents and/or inhibits electromagnetic interference and other desense issues in this area of the device. For example, the shielding layer may prevent or inhibit electromagnetic interference to an antenna employed by a device that is comprised of the described flexible display.

Figure 1A:
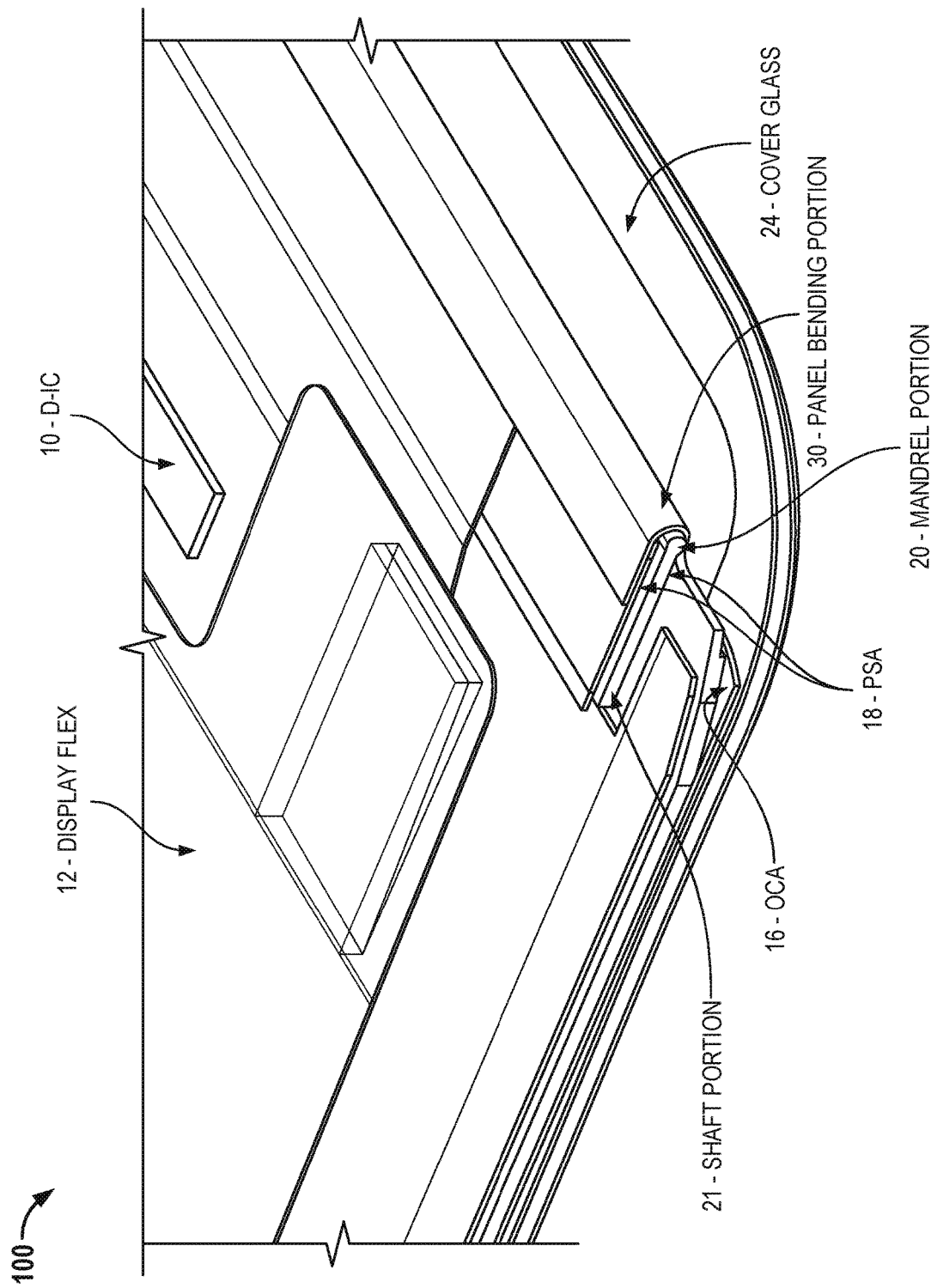
FIGS. 1A-1C illustrate embodiments of a flexible display which may be incorporated in electronic devices.
Figure 1B:
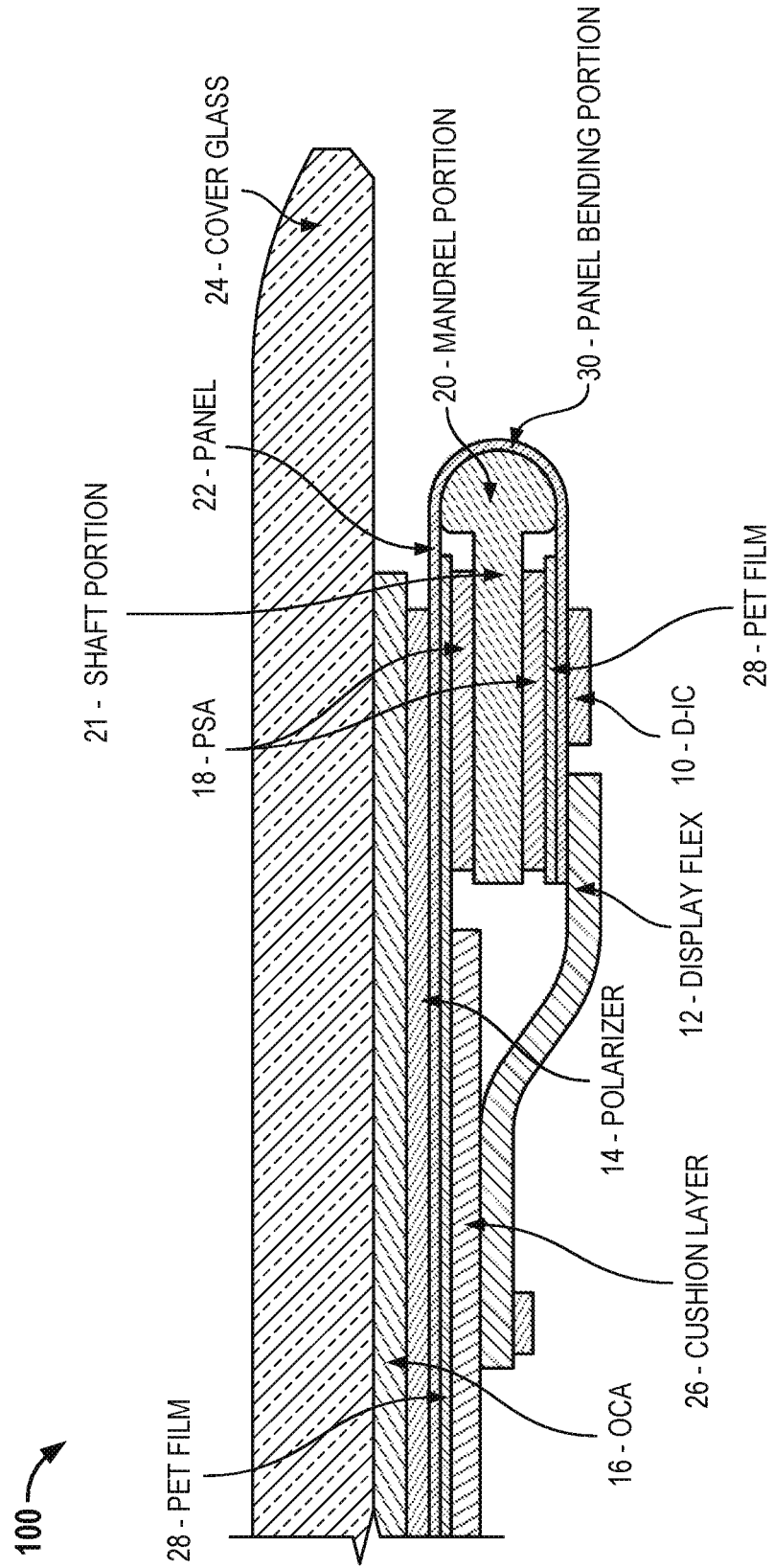
Figure 1C:
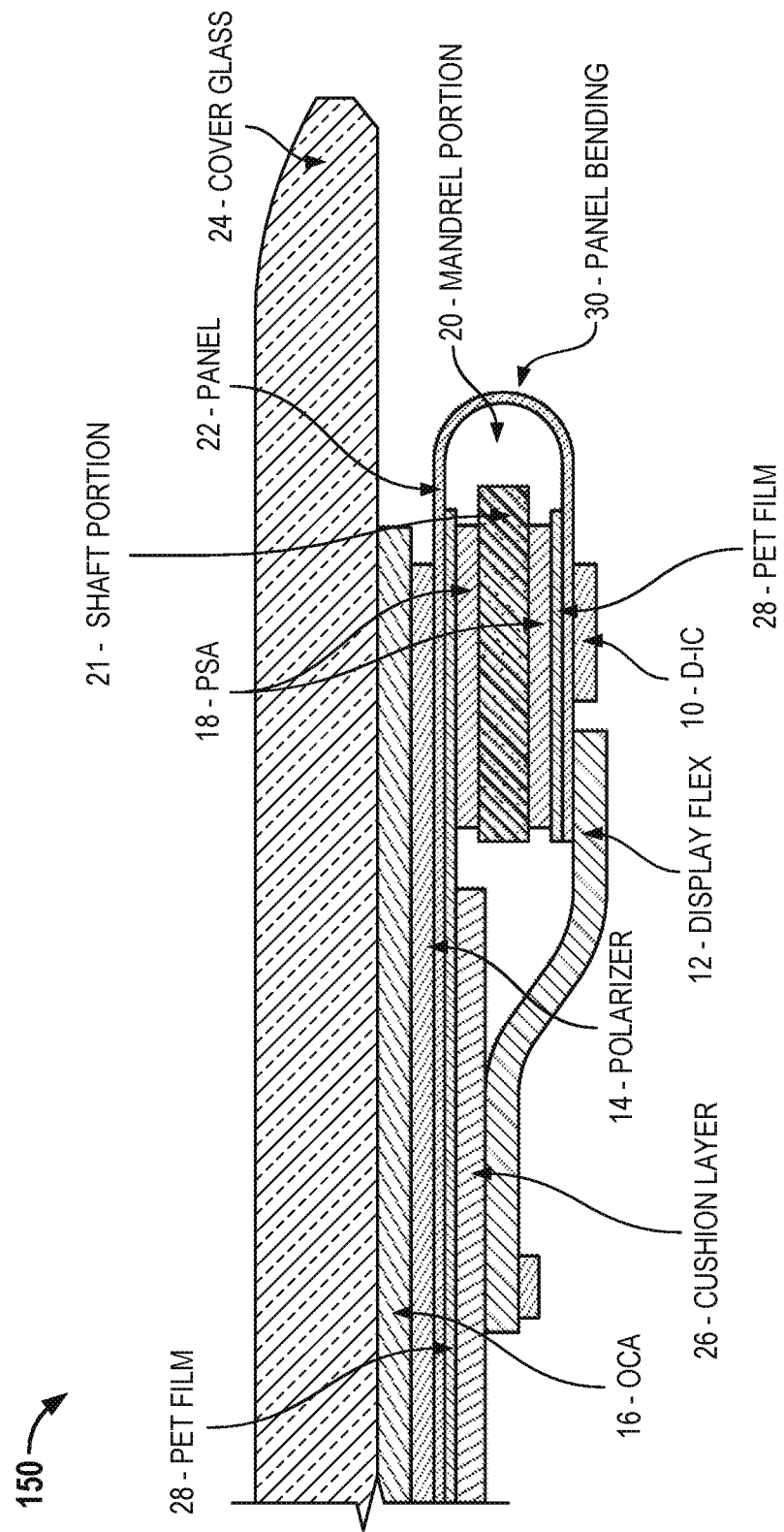

FIGS. 1A-1C illustrate embodiments of a flexible display which may be incorporated in electronic devices. FIG. 1A illustrates an isometric view of a flexible display 100. FIG. 1B illustrates a side view of the flexible display 100. FIG. 1C illustrates a side view of a flexible display 150. Flexible displays 100 and 150 are substantially similar to one another and illustrate different embodiments of a mandrel portion 20 and a shaft portion 21 (see the description of FIGS. 1A-1C below for more detail).

The flexible displays 100 and 150 include D-IC 10, display flex 12, polarizer 14, optically clear adhesive (OCA) 16, pressure-sensitive adhesive 18, mandrel portion 20, shaft portion 21, panel 22, cover glass 24, cushion layer 26, polyethylene terephthalate (PET) film 28, and panel bending portion 30. In some implementations, the D-IC 10 provides an interface function between a microprocessor, a microcontroller, an application-specific integrated circuit chips (ASIC), or a general-purpose peripheral interface and the flexible display 100 or 150. In some implementations, the D-IC 10 accepts commands and/or other types of data using a general-purpose serial or parallel interface, such as transistor-transistor logic (TTL), complementary metal-oxide-semiconductor (CMOS), recommended standard 232 (RS232), serial peripheral interface (SPI), inter-integrated circuit (I2C) and so forth. In some implementations, the D-IC 10 generates signals with suitable voltage, current, timing, and demultiplexing to cause the flexible display (e.g., 100 or 150) to display show the desired text and/or image. In some implementations, the D-IC 10 comprises an application-specific microcontroller and may incorporate random-access memory (RAM), flash memory, electrically erasable programmable read-only memory (EEPROM) and/or read only memory (ROM), which may be a fixed ROM that includes firmware and/or display fonts.

The display flex 12 may be employed to connect data and power between, for example, the system and the display panel 22. In some implementations, display flex 12 is a PI based, flexible printed circuit board. In some implementations, the Polarizer 14 comprises an optical filter that allows light waves of a specific polarization to pass through while blocking light waves of other polarizations. For example, the polarizer 14 can convert a beam of light of undefined or mixed polarization into a beam of well-defined polarization that is polarized light. In some implementations, PSA 14 is used for anti-reflection and sun glass readability for organic light emitting diodes (OLED) displays. The Polarizer 14 may be produced by venders such as, for example, 3M™, Nitto™, and Sumitomo™. In some implementations, OCA 16 comprises a layer of an optically clear adhesive that is used to attach the cover glass 24 and the polarizer 14. OCA 16 may be produced by venders such as, for example, 3M™, Nitto™, and Mitsubishi™.

In some implementations, PSA 18 bonds the PET film 28 to the shaft portion 21. In some implementations, PSA 18 is an adhesive which forms a bond when pressure is applied to marry the adhesive with the adherend (e.g., the surfaces of shaft portion 21 and the PET film 28). In some implementations, PSA 18 forms a bond that holds at room temperatures.

In some implementations, the mandrel portion 20 and the shaft portion 21 can be used to help form the shape of panel bending portion 30. As shown in FIGS. 1A and 1B, the mandrel portion 20 and the shaft portion 21 may be portions of the same component and may be comprised of a thermoplastic or thermosoftening plastic, such as polycarbonate-Acrylonitrile Butadiene Styrene (ABS). Thermoplastic is a plastic material or a polymer that becomes pliable and/or moldable above a specific temperature and solidifies upon cooling. As shown in FIG. 1C, the shaft portion 21 can be an element that is formed of a material and the mandrel portion 20 can be empty space. In such embodiments, the shaft portion may be comprised of a foam material, such as polyurethane.

In some implementations, the panel 22 is comprised of a conductive material, such as copper or aluminum alloy. The panel 22 may also include a substrate (not shown) that is comprised of PI (e.g., plastic) and includes an active area where, for example, images are displayed.

As shown in FIGS. 1A-1C, the panel 22 can be wrapped around the mandrel portion 20 and the shaft portion 21 to form panel bending portion 30. Once wrapped, the panel 22 can be adhered to the shaft portion 21 with the PSA 18. In some implementations, the PET film 28 is applied to the surface of the panel 22 that wraps around the shaft portion 21. In such implementations, PSA 18 bonds the shaft portion 21 to the PET film 28 that is applied to the inside surface of panel 22. The layers of the formed panel bending portion 30 are shown in greater detail in FIGS. 2-4C.

The cushion layer 26 protects panel 22 and provides electrical grounding and thermal dissipation. In some implementations, the cushion layer 26 is comprised of adhesion, foam, and conductive (e.g., copper) layers. The cover glass 24 is a top layer of flexible displays 100 and 150 (e.g., the screen) and may be comprised of a hard or toughened glass, such as aluminosilicate glass. Toughened glass is designed to resist shattering and scratching. In some implementations, the toughened glass is.

FIGS. 2, 3A-B, and 4A-4C illustrate various embodiments of the panel bending portion 30 of flexible displays 100 and 150 with an added shielding layer at the bending. The shielding layer prevents and/or inhibits electromagnetic interference in this area of the device. For simplicity, the mandrel portion 20 and shaft portion 21 are illustrated as they are depicted in flexible display 150 (e.g., with an empty or air filled mandrel portion 20); however, other embodiments include the mandrel portion 20 and shaft portion 21 comprising a single element, such as illustrated in flexible display 100 (as shown in FIGS. 1A and 1B).

Figure 2:
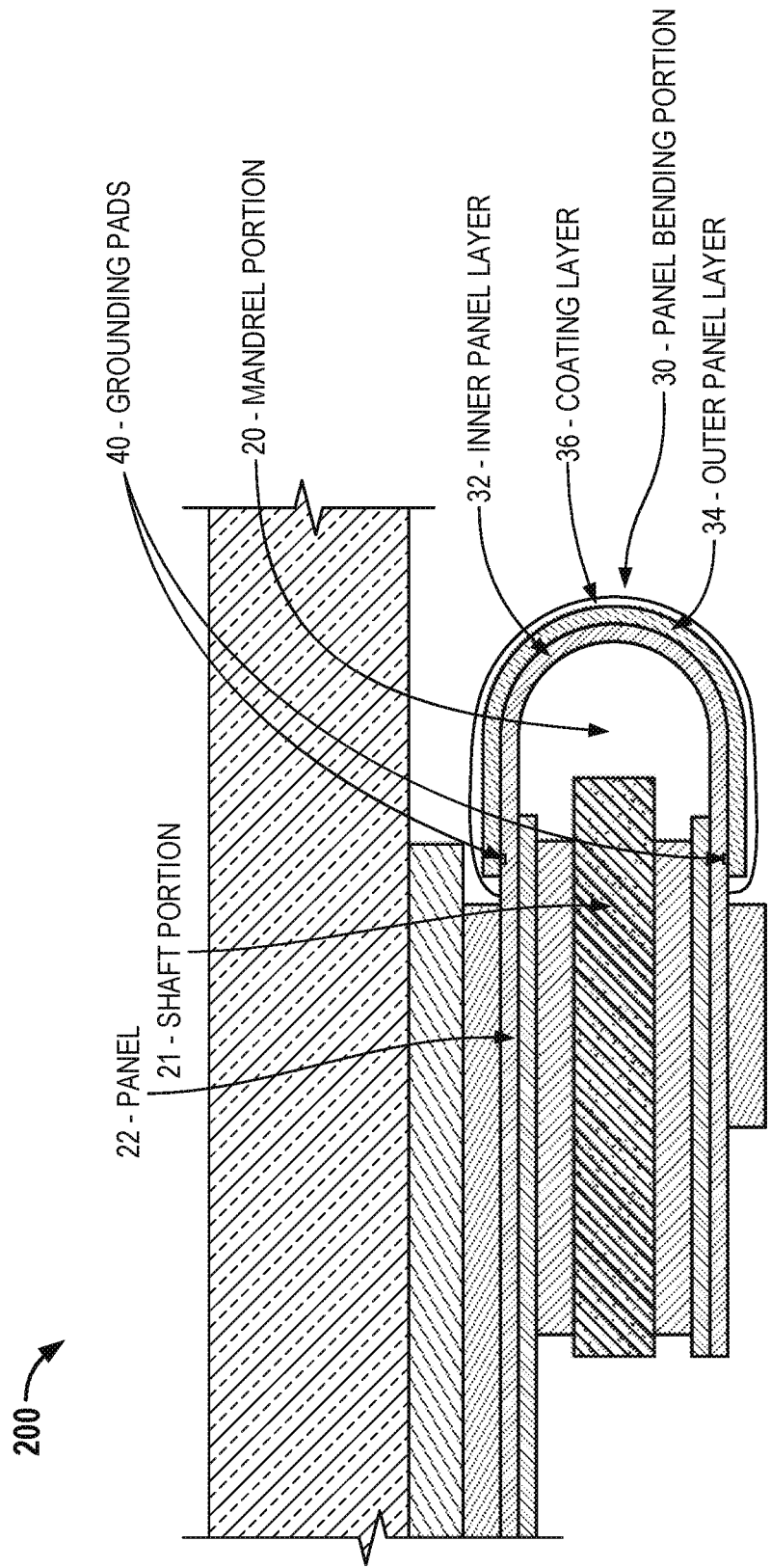

FIG. 2 illustrates a side view of an embodiment 200 of a double layer panel bending, with a shielding layer at the bending. As depicted, the panel bending portion 30 is an element of a flexible display, such as flexible displays 100 and 150. The embodiment 200 includes panel 22, shaft portion 21, mandrel portion 20, and panel bending portion 30, as shown in flexible display 150. As depicted, the panel bending portion 30 includes inner panel layer 32, outer layer panel 34, coating layer 36, and grounding pads or vias 40.

In some implementations, the inner panel layer 32 and the outer layer panel 34 are metal trace layers comprised of a conductive material, such as copper or aluminum. The coating layer 36 prevents moisture ingression and adjusts locations of stress in the panel member at the panel bending 30. The coating layer 36 may be comprised of a curable epoxy, such as Loctitie. In some implementations, the coating layer 36 is 10 μm~100 μm thick and the inner panel layer 32 has a sub-micron thickness.

In the depicted example, the grounding pads 40 are embedded in panel 22 (in the inner panel layer 32). Grounding pads 40 may be employed to electrically connect the outer layer panel 34 to the inner panel layer 32 (e.g., the metal trace) inside of the panel 22.

Figure 3A:
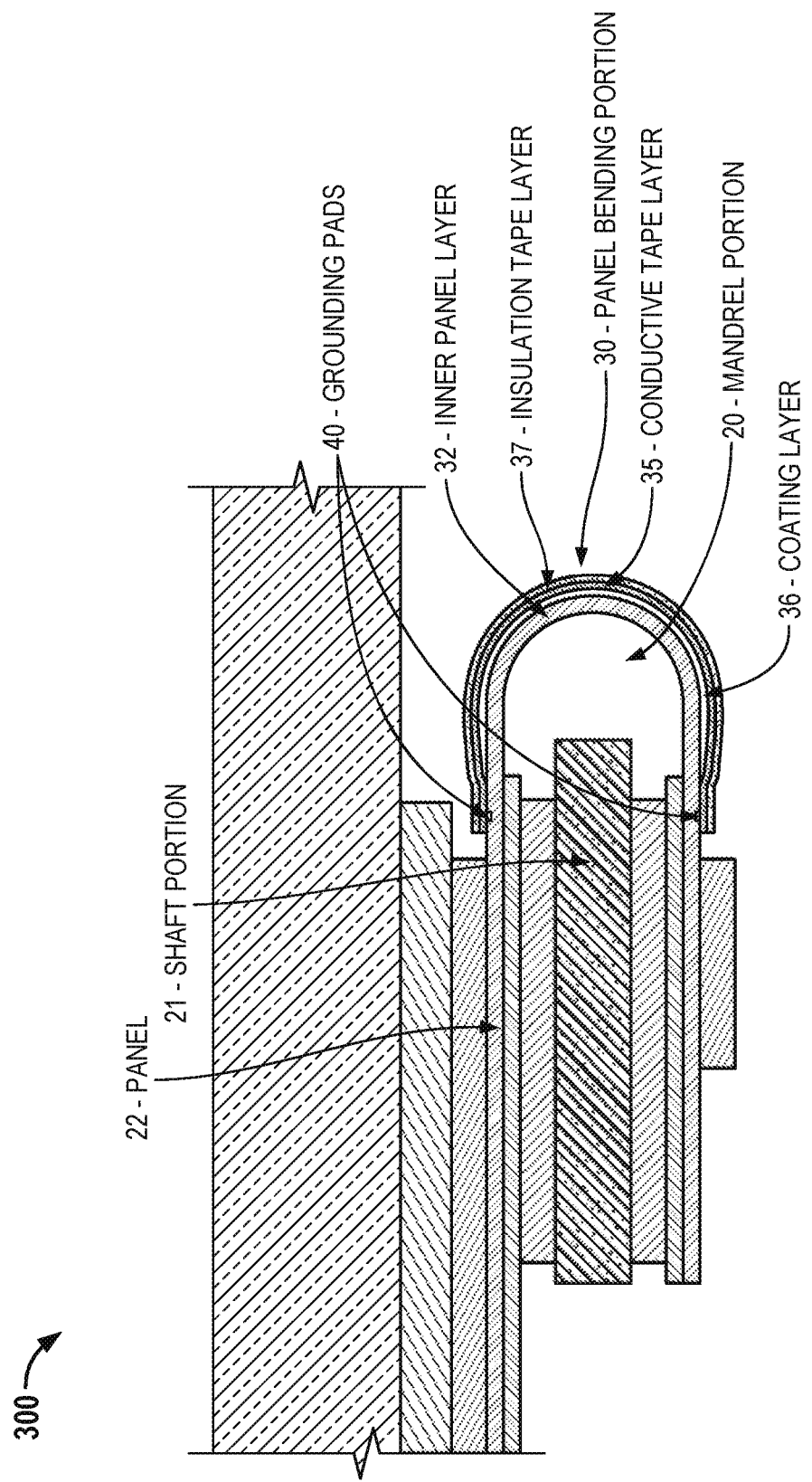
Figure 3B:
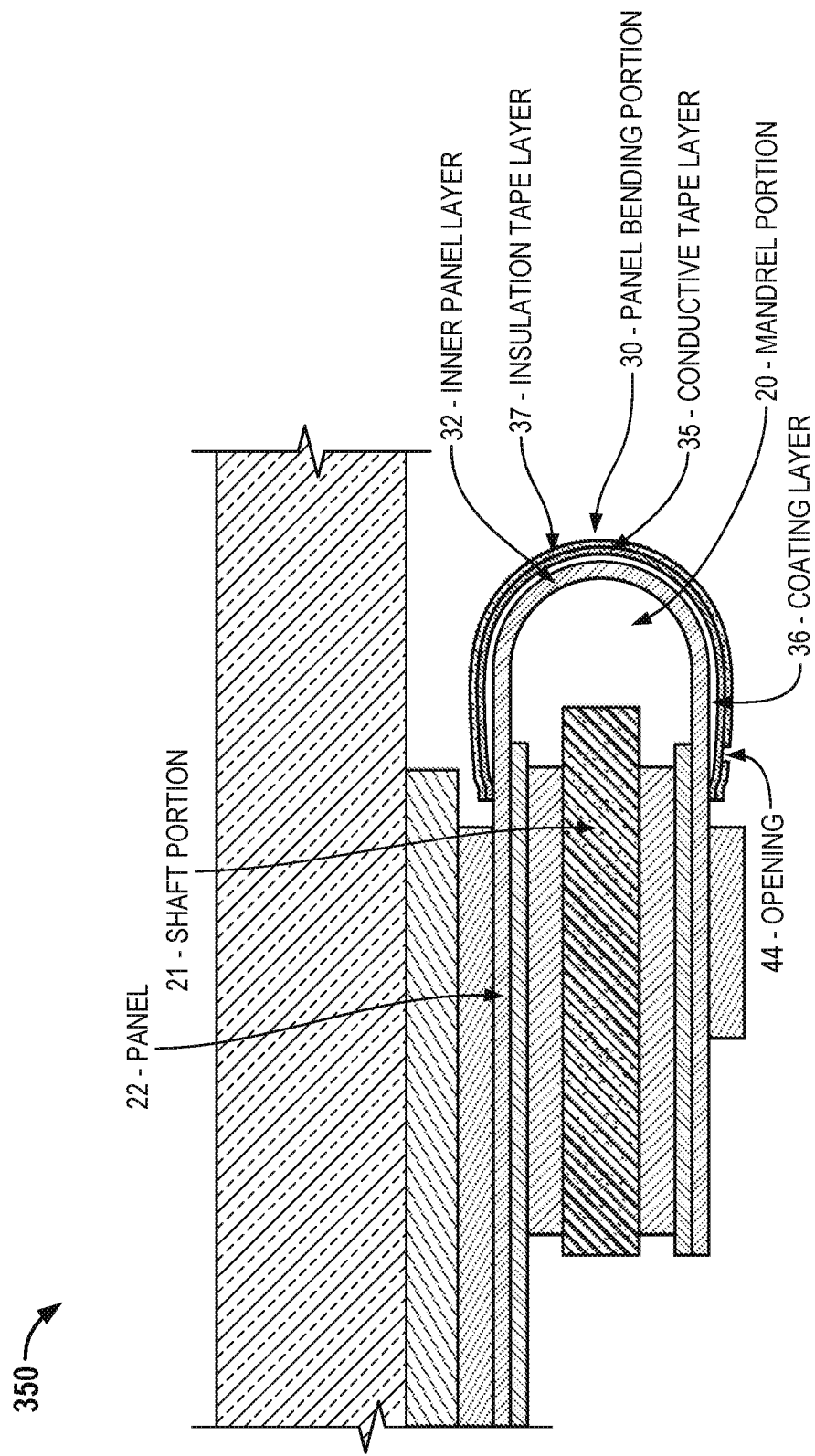

FIGS. 3A-3B illustrate respectively a side view of embodiments 300 and 350 of a panel bending portion 30 in which conductive tape or foil is attached over the bending. As depicted, the panel bending portion 30 is an element of a flexible display, such as flexible displays 100 and 150. The embodiments 300 and 350 include panel 22, shaft portion 21, mandrel portion 20, and panel bending portion 30 as shown in flexible display 150. The panel bending portion 30 includes inner panel layer 32, coating layer 36, conductive tape layer 35, and insulation layer 37. Inner panel layer 32 and coating layer 36 are substantially similar to the same components of embodiment 200. In some implementations, the applied conductive tape or foil includes conductive layer 35 and insulation layer 37, which form layers of the panel bending portion 30 once the panel is bent around the shaft and mandrel portions.

In some implementations, the conductive tape is 10 μm~100 μm thick. The conductive tape may be added to the panel 22 before the bending process takes place and after the coating layer 36 is applied to the panel 22. The conductive tape may be attached to the panel 22 by a conductive PSA, and then bent together with panel 22 during a bending process to form panel bending portion 30. In embodiments 300 and 350, the coating layer 36 may be thinner (from 100 μm to 50 μm) than the coating in embodiment 200 of FIG. 2 because of the added extra shielding layer (e.g., conductive tape layer 35). In some implementations, the coating layer 36 may be removed completely and replaced by the conductive tape layer 35 and insulation tape layer 37.

As depicted in FIG. 3A, embodiment 300 includes grounding pads or vias 40, which are embedded in panel 22 (in the inner panel layer 32). Grounding pads 40 are substantially similar to the same components of embodiment 200 and may be employed to electrically connect the conductive tape layer 35 to the inner panel layer 32 (e.g., the metal trace) inside of the panel 22. Alternatively, as depicted in FIG. 3B, embodiment 350 includes opening 44. In some implementations, the opening 44 is formed in the insulation tape layer 37 to expose a portion of the conductive tape layer 35. In such implementations, the portion of conductive tape layer 35 exposed by the opening 44 may be employed to connect to the system ground for shielding, by, for example, a conductive PSA, paste, or spring finger.

Figure 4A:
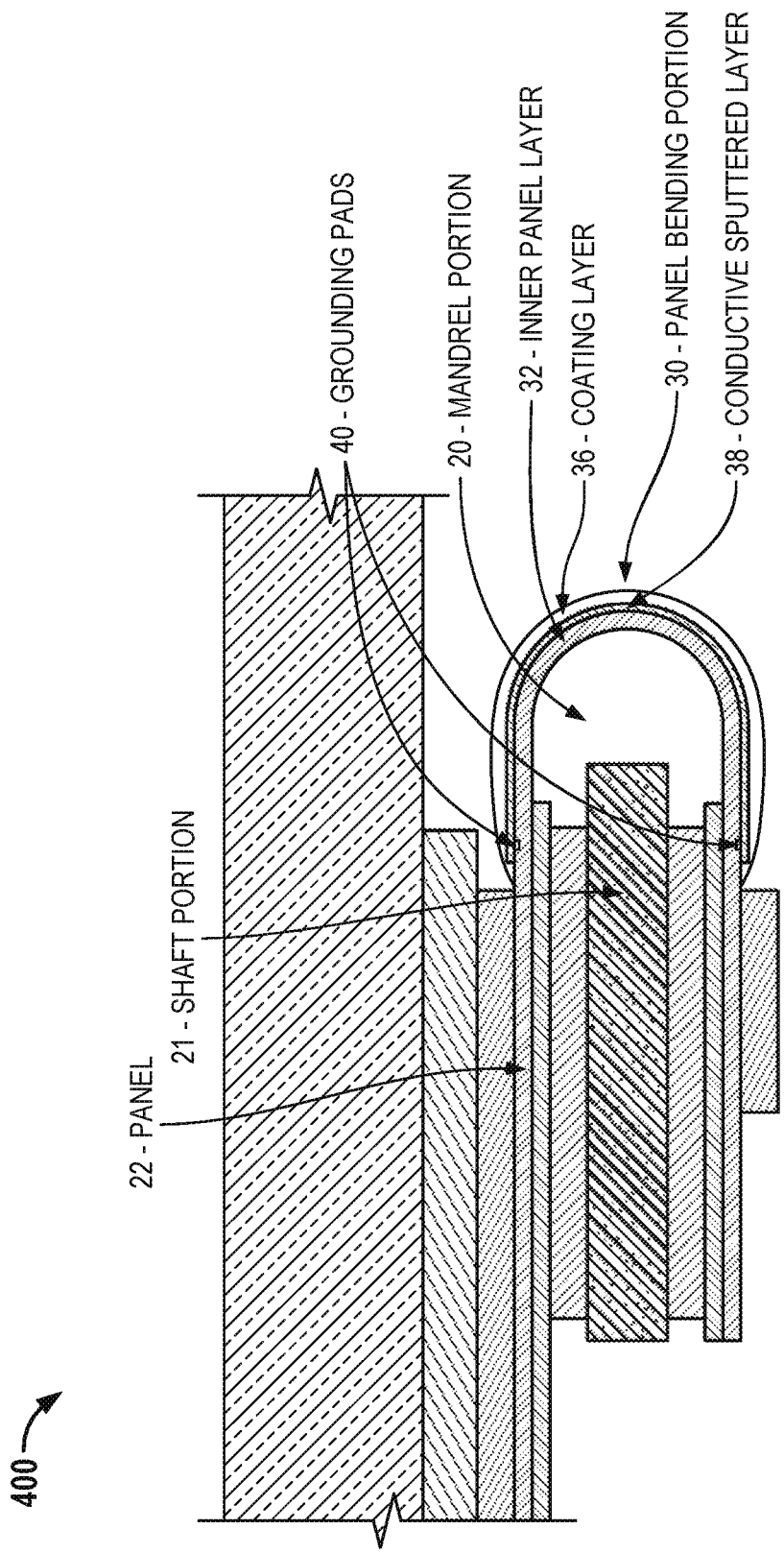
Figure 4B:
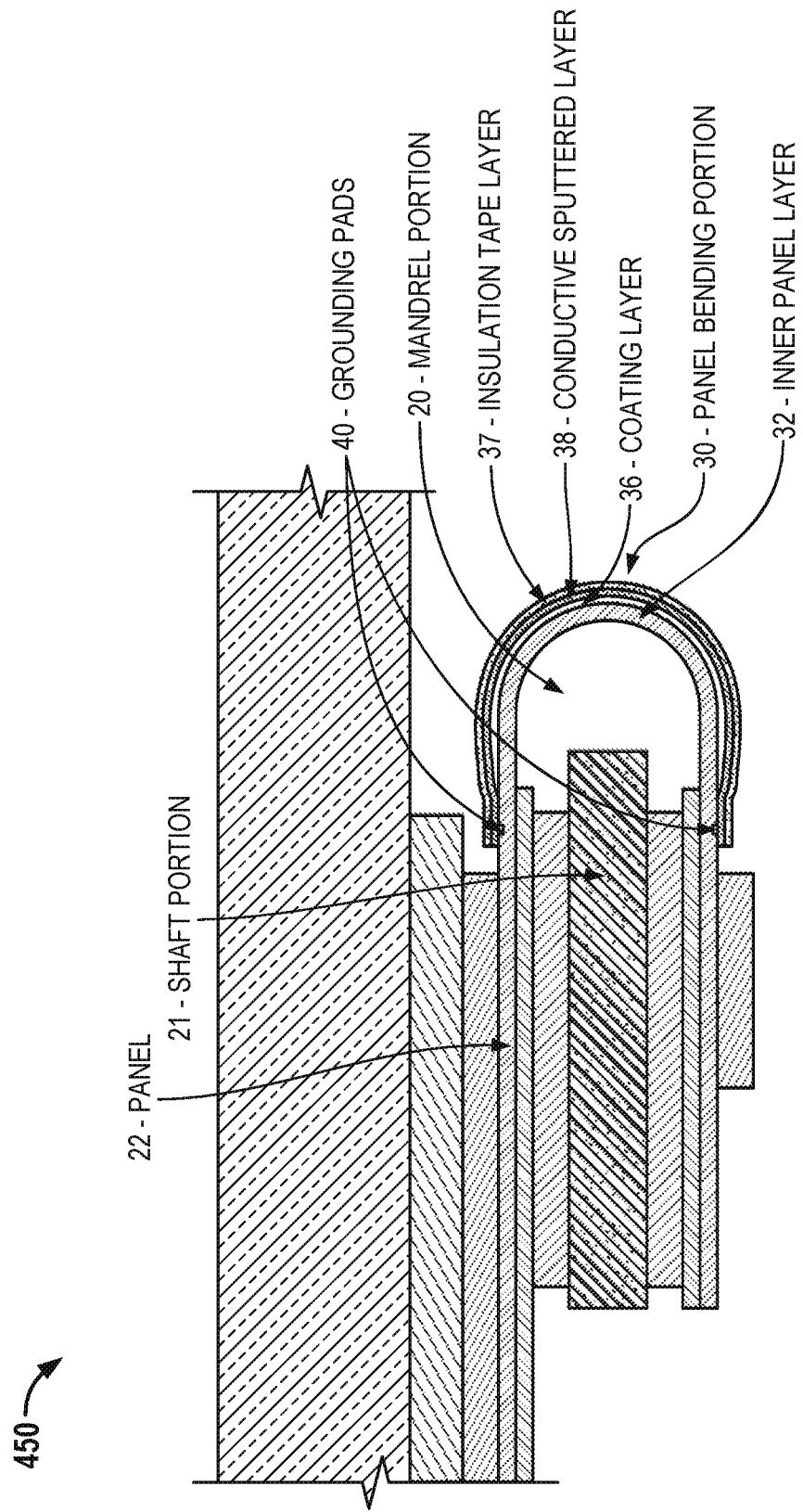

FIGS. 4A-4C illustrates respectively a side view of embodiments 400, 450, and 470 of a panel bending portion 30 in which a thin layer of conductive material, such as copper or aluminum, is deposited by sputtering or printing over a layer of the panel bending portion 30. As depicted, panel bending portion 30 is an element of a flexible display, such as flexible displays 100 and 150. The embodiments 400, 450, and 470 include panel 22, shaft portion 21, mandrel portion 20, and panel bending portion 30, as shown in flexible display 150.

As depicted in FIG. 4A, embodiment 400 comprises a panel bending portion 30 that includes inner panel layer 32, coating layer 36, and conductive sputtered layer 38. Inner panel layer 32 and coating layer 36 are substantially similar to the same components of embodiment 200, 300, and 350. In some implementations, conductive sputtered layer 38 is deposited as a shielding layer at the panel bending portion 30 by sputtering or printing the conductive material inside of the coating layer 36 (e.g., before the coating layer 36 is applied) and over the inner panel layer 32. In some implementations, the conductive sputtered layer 38 is applied to a thickness of between 5 μm~20 μm.

As depicted in FIGS. 4B and 4C, embodiments 450 and 470 each have a panel bending portion 30 that includes inner panel layer 32, coating layer 36, conductive sputtered layer 38, and insulation tape layer 37. Inner panel layer 32 and coating layer 36 are substantially similar to the same components of embodiment 200, 300, 350, and 400. In some implementations, conductive sputtered layer 38 is deposited as a shielding layer at the panel bending portion 30 by sputtering or printing the conductive material over the coating layer 36 (e.g., after the coating layer 36 is applied). In some implementations, the conductive sputtered layer 38 is applied to a thickness of between 5 μm~20 μm. Insulating tape layer 37 is added over the conductive sputtered layer 38. In some implementations, insulating tape layer 37 is comprised of polyester or PI.

As depicted in FIGS. 4A and 4B, embodiments 400 and 450 each include grounding pads or vias 40, which are embedded in panel 22 (in the inner panel layer 32). Grounding pads 40 are substantially similar to the same components of embodiment 200 and 300 and may be employed to electrically connect the conductive sputtered layer 38 (whether inside the coating layer 36 as depicted in embodiment 400 or outside of the coating layer 36 as depicted in embodiment 450) to the inner panel layer 32 (e.g., the metal trace) inside of the panel 22. Alternatively, as depicted in FIG. 4C, embodiment 470 includes opening 44. Similar to embodiment 350 in FIG. 3B, the opening 44 is formed in the insulation tape layer 37 to expose a portion of the conductive sputtered layer 38. In some implementations, the portion of conductive tape layer 35 exposed by the opening 44 may be employed to connect to the system ground for shielding, by, for example, a conductive PSA, paste, or spring finger.

Figure 5:
FIG. 5 depicts a flow diagram of an example process employed to manufacture a flexible display.

FIG. 5 depicts a flow diagram of an example process (500) employed to manufacture a flexible display as described above. The first step in the described process wraps (502) a panel, such as panel 22, around a mandrel portion, such as mandrel portion 20, to form a bending portion of the panel. The next step in the process attaches (504) the wrapped panel on either side of a shaft portion, such as shaft portion 21. The next step positions (506) the panel and wrapped mandrel portion between a cover glass element, such as cover glass 24, and a D-IC, such as D-IC 10. The next step in the process forms (508) a shielding layer, such as outer layer panel 34, conductive tape layer 35, or conductive sputtered layer 38, positioned around the bending portion of the panel. The shielding layer is configured to inhibit electromagnetic signals through the bending portion.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A flexible display apparatus, comprising:
    a cover glass element;
    a driver integrated circuit (D-IC);
    a mandrel portion;
    a shaft portion;
    a panel, positioned between the cover glass element and the D-IC, and comprising an inner panel layer that wraps around at least a portion of the mandrel portion to form a bending portion of the panel, the panel attached on either side on the shaft portion;
    a shielding layer positioned around the inner panel layer and configured to inhibit electromagnetic signals through the bending portion; and
    at least two grounding pads positioned between the inner panel layer and the shielding layer and on opposite sides of the mandrel portion.

2. The flexible display apparatus of claim 1, further comprising a coating layer over the shielding layer.

3. The flexible display apparatus of claim 2, wherein the coating layer has an opening exposing a portion of the shielding layer.

4. The flexible display apparatus of claim 2, wherein the coating layer comprises a polyimide (PI) substrate.

5. The flexible display apparatus of claim 2, further comprising a second coating layer, wherein the second coating layer is positioned between the shielding layer and the inner panel layer.

6. The flexible display apparatus of claim 5, wherein the coating layer and the shielding layer are layers of a conductive tape positioned around the second coating layer.

7. The flexible display apparatus of claim 6, wherein the conductive tape has a thickness between 10 micrometers (μm) and 100 μm, and wherein the second coating layer has a thickness of between 100 μm to 50 μm.

8. The flexible display apparatus of claim 1, wherein the inner panel layer comprises a conductive material, and wherein the shielding layer comprises a second conductive material.

9. The flexible display apparatus of claim 1, wherein the panel is attached to either side of the shaft portion with pressure sensitive adhesive.

10. The flexible display apparatus of claim 1, wherein the shielding layer comprises a thin conductive layer deposited by sputtering or printing over the bending portion of the panel, and wherein the shielding layer has a thickness of between 5 μm and 20 μm.

11. The flexible display apparatus of claim 1, wherein the shaft portion comprises a foam material, and wherein the mandrel portion comprises an empty space.

12. The flexible display apparatus of claim 1, wherein the shaft portion and the mandrel portion are portions of a same component, and wherein the same component comprises a plastic material.

13. The flexible display apparatus of claim 12, wherein the plastic material comprises a thermosoftening plastic.

14. A method of forming a mobile communication device flexible display apparatus comprising:
    wrapping a panel around a mandrel portion to form a bending portion of the panel;
    attaching the wrapped panel on either side of a shaft portion;
    positioning the panel and wrapped mandrel portion between a cover glass element and a driver integrated circuit (D-IC);
    forming a shielding layer positioned around the bending portion of the panel, the shielding layer configured to inhibit electromagnetic signals through the bending portion; and
    before forming the shielding layer, positioning at least two grounding pads on the bending portion and on opposite sides of the mandrel portion.

15. The method of claim 14, further comprising forming a coating layer over the shielding layer.

16. The method of claim 15, further comprising forming an opening in the coating layer to expose a portion of the shielding layer.

17. The method of claim 15, further comprising before forming the shielding layer, forming a second coating layer positioned around the bending portion of the panel, wherein the shielding layer is formed around the second coating layer.

18. The method of claim 15, wherein the conductive tape has a thickness between 10 μm and 100 μm, and wherein the second coating layer has a thickness of between 100 μm to 50 μm.

19. The method of claim 15, wherein the inner panel layer comprises a conductive material, and wherein the shielding layer comprises a second conductive material.

20. A mobile communication device, comprising:
   a cover glass element;
   a driver integrated circuit (D-IC);
   a mandrel portion;
   a shaft portion;
   a panel, positioned between the cover glass element and the D-IC, and comprising an inner panel layer that wraps around at least a portion of the mandrel portion to form a bending portion of the panel, the panel attached on either side on the shaft portion;
   a shielding layer positioned around the inner panel layer and configured to inhibit electromagnetic signals through the bending portion; and
   at least two grounding pads positioned between the inner panel layer and the shielding layer and on opposite sides of the mandrel portion.

* * * * *